US011791237B2

(12) United States Patent
Li et al.

(10) Patent No.: US 11,791,237 B2
(45) Date of Patent: Oct. 17, 2023

(54) MICROELECTRONIC ASSEMBLIES INCLUDING A THERMAL INTERFACE MATERIAL

(71) Applicant: Intel Corporation, Santa Clara, CA (US)

(72) Inventors: Peng Li, Portland, OR (US); Sergio Antonio Chan Arguedas, Chandler, AZ (US); Yongmei Liu, Chandler, AZ (US); Deepak Goyal, Phoenix, AZ (US); Ken Hackenberg, Plano, TX (US)

(73) Assignee: Intel Corporation, Santa Clara, CA (US)

( * ) Notice: Subject to any disclaimer, the term of this patent is extended or adjusted under 35 U.S.C. 154(b) by 812 days.

(21) Appl. No.: 16/019,899

(22) Filed: Jun. 27, 2018

(65) Prior Publication Data

US 2020/0006192 A1    Jan. 2, 2020

(51) Int. Cl.
*H01L 23/42* (2006.01)
*H01L 23/367* (2006.01)
(Continued)

(52) U.S. Cl.
CPC ............ *H01L 23/42* (2013.01); *H01L 23/367* (2013.01); *H01L 23/373* (2013.01); *H01L 23/3736* (2013.01); *H01L 24/29* (2013.01)

(58) Field of Classification Search
CPC ............. H05K 7/2039; H05K 7/20154; H05K 7/20472–20481; H05K 1/0201–0203;
(Continued)

(56) References Cited

U.S. PATENT DOCUMENTS 2,596,486 A * 5/1952 Jaffee ................... C22C 14/00
420/418
4,603,090 A * 7/1986 Mizuhara ........... B23K 35/0233
428/606
(Continued)

FOREIGN PATENT DOCUMENTS

DE      102020108636 A1    12/2020

OTHER PUBLICATIONS

The Wetting of Alumina by copper alloyed with titanium and other elements. Journal of Materials Science 15 (1980) 2197-2206 (Year: 1980).*

(Continued)

*Primary Examiner* — Amir A Jalali
(74) *Attorney, Agent, or Firm* — Akona IP

(57) ABSTRACT

Microelectronic assemblies, and related devices and methods, are disclosed herein. For example, in some embodiments, a microelectronic assembly may include a package substrate having a first surface and an opposing second surface; a die having a first surface and an opposing second surface, wherein the first surface of the die is coupled to the second surface of the package substrate; a cooling apparatus thermally coupled to the second surface of the die; and a thermal interface material (TIM) between the second surface of the die and the cooling apparatus, wherein the TIM includes an indium alloy having a liquidus temperature equal to or greater than about 245 degrees Celsius.

13 Claims, 4 Drawing Sheets

(51) Int. Cl.
*H01L 23/373* (2006.01)
*H01L 23/00* (2006.01)

(58) Field of Classification Search
CPC ....... H01L 23/06; H01L 23/053; H01L 23/10; H01L 23/367; H01L 23/3733; H01L 23/40; H01L 23/42; H01L 23/373; H01L 23/3675; H01L 23/3736; H01L 24/73; H01L 24/32; H01L 24/83; H01L 24/29; H01L 21/4882; H01L 21/50; H01L 21/563; H01L 2023/4075–4087; B23K 35/26; C22C 13/00
See application file for complete search history.

(56) References Cited

U.S. PATENT DOCUMENTS

| | | | |
|---|---|---|---|
| 6,724,078 B1 | 4/2004 | Sur et al. | |
| 6,757,170 B2 | 6/2004 | Lee et al. | |
| 6,790,709 B2 | 9/2004 | Dias et al. | |
| 6,812,548 B2 | 11/2004 | Dias et al. | |
| 7,312,527 B2 | 12/2007 | Sane et al. | |
| 7,663,242 B2 * | 2/2010 | Lewis | H01L 23/3736 257/772 |
| 7,813,133 B2 | 10/2010 | Iijima et al. | |
| 7,999,394 B2 | 8/2011 | Too et al. | |
| 8,409,929 B2 * | 4/2013 | Renavikar | H01L 23/42 438/121 |
| 8,513,800 B2 | 8/2013 | Kurita et al. | |
| 10,643,924 B1 | 5/2020 | Shen | |
| 2003/0077478 A1 | 4/2003 | Dani et al. | |
| 2003/0209801 A1 * | 11/2003 | Hua | H01L 23/36 257/E23.101 |
| 2004/0262740 A1 | 12/2004 | Matayabas et al. | |
| 2004/0262766 A1 | 12/2004 | Houle | |
| 2005/0040518 A1 * | 2/2005 | Brandenburg | H05K 7/20436 257/712 |
| 2006/0227510 A1 | 10/2006 | Fitzgerald et al. | |
| 2007/0117270 A1 * | 5/2007 | Renavikar | H01L 23/42 438/122 |
| 2007/0145546 A1 * | 6/2007 | Lewis | B23K 35/302 257/675 |
| 2007/0164424 A1 | 7/2007 | Dean et al. | |
| 2008/0067671 A1 | 3/2008 | Kurita et al. | |
| 2008/0122066 A1 | 5/2008 | Ishii | |
| 2008/0264504 A1 | 10/2008 | Gossett et al. | |
| 2008/0293188 A1 | 11/2008 | Hua et al. | |
| 2010/0112360 A1 | 5/2010 | Delano | |
| 2010/0129648 A1 | 5/2010 | Xu et al. | |
| 2010/0319898 A1 | 12/2010 | Underwood et al. | |
| 2012/0153448 A1 | 6/2012 | Ihara et al. | |
| 2012/0305632 A1 * | 12/2012 | Ross | H01L 23/36 228/180.21 |
| 2014/0167246 A1 | 6/2014 | Ihara et al. | |
| 2014/0262192 A1 | 9/2014 | Boday et al. | |
| 2015/0279761 A1 | 10/2015 | Bet-Shliemoun | |
| 2016/0037649 A1 * | 2/2016 | Barber | B32B 15/01 361/772 |
| 2016/0148894 A1 * | 5/2016 | Zhu | H01L 24/29 257/746 |
| 2017/0086320 A1 * | 3/2017 | Barber | H05K 3/3463 |
| 2017/0186887 A1 * | 6/2017 | Hahn | B23K 1/0053 |
| 2017/0197281 A1 * | 7/2017 | Choudhury | H01L 24/29 |
| 2017/0321100 A1 * | 11/2017 | Zhang | H01L 23/3737 |
| 2018/0145006 A1 | 5/2018 | Na et al. | |
| 2018/0358280 A1 | 12/2018 | Gandhi et al. | |
| 2019/0393121 A1 | 12/2019 | Swaminathan et al. | |
| 2020/0006192 A1 | 1/2020 | Li et al. | |
| 2020/0020609 A1 | 1/2020 | Yamaura et al. | |
| 2020/0357764 A1 | 11/2020 | Mahapatra et al. | |
| 2020/0381332 A1 | 12/2020 | Saha et al. | |
| 2020/0381334 A1 | 12/2020 | Visvanathan et al. | |
| 2020/0395269 A1 | 12/2020 | Dubey et al. | |

OTHER PUBLICATIONS

"SMIC Lead Free Solder Catalog", Senju Metal Industry Co., Ltd., 2018, 12 pages.

* cited by examiner

MICROELECTRONIC ASSEMBLIES INCLUDING A THERMAL INTERFACE MATERIAL

BACKGROUND

Electronic components, such as microprocessors and integrated circuits, generally produce heat. Excessive heat may degrade performance, reliability, life expectancy of an electronic component and may even cause component failure. Heat sinks, heat spreaders, heat pipes, and other similar thermal solutions including a thermal interface material (TIM) are commonly used for dissipating heat and reducing the operational temperature of electronic components.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
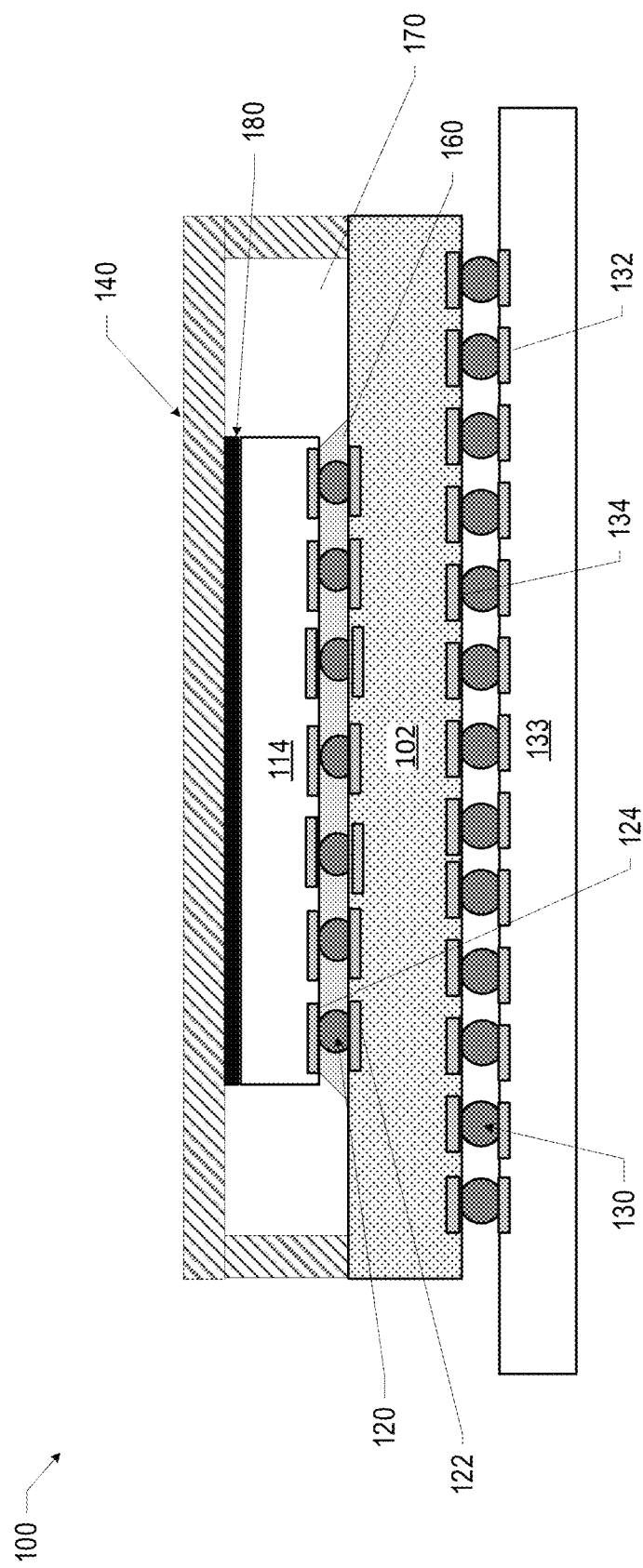
FIG. 1 is a side, cross-sectional view of an example microelectronic assembly, in accordance with various embodiments.

Microelectronic assemblies, and related devices and methods, are disclosed herein. For example, in some embodiments, a microelectronic assembly may include a package substrate having a first surface and an opposing second surface; a die having a first surface and an opposing second surface, wherein the first surface of the die is coupled to the second surface of the package substrate; a cooling apparatus thermally coupled to the second surface of the die; and a TIM between the second surface of the die and the cooling apparatus, wherein the TIM includes an indium alloy having a liquidus temperature equal to or greater than about 245 degrees Celsius.

In some embodiments, a microelectronic assembly, may include a package substrate having a first surface and an opposing second surface; a die having a first surface and an opposing second surface, wherein the first surface of the die is coupled to the second surface of the package substrate; a cooling apparatus thermally coupled to the second surface of the die; and a TIM between the second surface of the die and the cooling apparatus, wherein the TIM includes indium, and one or more of: nickel (Ni), gold (Au), titanium (Ti), copper (Cu), and aluminum (Al).

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques may exhibit rounded corners, surface roughness, and other features. As used herein, a dimension in the x-direction is a length, a dimension in the y-direction is a width, and a dimension in the z-direction is a thickness or a height.

Various aspects of the illustrative implementations may be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The description uses the phrases "in an embodiment" or "in some embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. Although certain elements may be referred to in the singular herein, such elements may include multiple sub-elements. For example, "an insulating material" may include one or more insulating materials, and a "conductive layer" may include one or more conductive layers.

FIG. 1 is a side, cross-sectional view of a microelectronic assembly 100, in accordance with various embodiments. The microelectronic assembly 100 may include a die 114 coupled to a package substrate 102, and a cooling apparatus 140 in thermal contact with the die 114 and coupled to the package substrate 102. In some embodiments, a TIM 180 may be between the second surface of the die 114 and the cooling apparatus 140. The TIM 180 may be made of any suitable material and may include an indium (In) alloy. In some embodiments, the TIM 180 may have a liquidus temperature equal to or greater than about 245° C. In some embodiments, the TIM 180 may have a solidus temperature between about 125° C. and 160° C. In some embodiments, the TIM 180 may include an In alloy having a liquidus temperature equal to or greater than about 245° C. and a solidus temperature between about 125° C. and 160° C. In some embodiments, the TIM 180 may include a binary In alloy, where the In alloy includes In and Ni, Au, Ti, Cu, or Al. For example, in some embodiments, the In alloy may include two elements, such as In—Ni, In—Au, or In—Al. In some embodiments, the TIM 180 may include a ternary In alloy or a quaternary In alloy, where the In alloy includes In and two more of Ni, Au, Ti, Cu, and Al. In some embodiments, a ternary In alloy and quaternary In alloy may include silver (Ag), where the In alloy includes In, Ag, and one or more of Ni, Au, Ti, Cu, and Al. For example, in some embodiments, the In alloy may include three or more elements, such as In—Au—Ni, In—Au—Ag, In—Au—Cu, In—Au—Ni—Al, or In—Au—Cu—Ti. The TIM 180 may have any suitable thickness. For example, in some embodiments, the TIM 180 may have a thickness between about 25 microns/micrometers (um) and 500 um. In some embodiments, the TIM 180 may have a thickness between about 50 um and 250 um.

Some conventional IC devices may include a cooling apparatus, such as a heat spreader, a heat sink, or a cold plate, in order to transport heat generated by the electronic component during operation away from the electronic component. Typically, a cooling apparatus is in thermal contact with a back surface of an electronic component on an IC package and transfers heat via thermal conduction. Some cooling apparatuses may include a TIM between the cooling apparatus and the surface of the electronic component to improve physical contact and thermal conduction. A TIM may include a solder material, such as tin (Sn), lead (Pb), antimony (Sb), etc. As IC devices become smaller, the power density increases. A more stable TIM may be desirable, where the TIM is less likely to seep or form voids at high temperatures. The microelectronic assemblies disclosed herein may be particularly advantageous for IC devices having ball grid array (BGA) interconnects, and other applications where IC devices experience temperatures of equal to or greater than about 245 degrees Celsius (° C.).

During the manufacturing process, a microelectronic assembly having BGA interconnects, or electronic components attached by surface-mount technology (SMT), may have processing temperatures of between about 245° C. and 260° C., or of greater than about 245° C. A conventional solder TIM typically has a liquidus temperature below 245° C. At these processing temperatures, a conventional solder TIM may melt, seep, bleed out, and/or form voids in the TIM, which may decrease thermal conduction efficiency. For example, pure In has a melting point of approximately 158° C., and may be likely to bleed out or form voids during BGA reflow processing. A TIM 180 having a liquidus temperature at or above 245° C. is likely to decrease the risk of TIM seepage and/or void formation during BGA reflow or SMT processing.) A TIM 180 having a solidus temperature between about 125° C. and 160° C. is likely to maintain the TIM at solid form during die operation and die testing as the operating temperature of a die typically is between 90° C. and 120° C., and the die testing temperature is typically below 150° C. The TIM 180 may be applied to a die using any suitable technique, such as by placing the TIM 180 between a die 114 and a cooling apparatus 140 with or without flux, and then reflowing.

An intermetallic compound may be formed at the interface between the TIM 180 and the cooling apparatus 140, and at the interface between the TIM 180 and the die 114. For example, in some embodiments, the microelectronic assembly 100 may include the TIM including an In—Ni alloy and the cooling apparatus 140 with Au or without Au, such that the intermetallic compound between the cooling apparatus and the TIM may include $AuIn_2$ or $(NiAu)In_2$, and the die 114 with Au or Ni on the top surface, such that the intermetallic compound between the die and the TIM may include $AuIn_2$ or $Ni(Au)In_2$.

The package substrate 102 may include first conductive contacts 134 on a first surface and second conductive contacts 122 on an opposing second surface, the die 114 may include conductive contacts 124 on a first surface and an opposing second surface, and the conductive contacts 124 on the first surface of the die may be coupled to the second conductive contacts 122 on the second surface of the package substrate via first level interconnects 120. In some embodiments, an underfill material 160, such as a mold compound or an epoxy, may be disposed around the first level interconnects 120. In some embodiments, no underfill material may be disposed around the first level interconnects.

The cooling apparatus 140 may include any suitable cooling apparatus, for example, a heat spreader, an integrated heat spreader, a heat sink, or a cold plate, among others. In some embodiments, the cooling apparatus may include a conductive base having vertical fins (not shown) or other features. The cooling apparatus may be coupled to, and in thermal contact with, the second surface of the die to dissipate heat from the die 114. In some embodiments, the cooling apparatus 140 may be attached to the second surface of the package substrate (as shown). In some embodiments, the area 170 surrounding the die 114 (e.g., the area between the cooling apparatus 140 and the second surface of the package substrate 102) may be filled with an epoxy or adhesive material. In some embodiments, the area 170 surrounding the die 114 may be filled with air. The cooling apparatus 140 may further include a fluid inlet and fluid outlet, and pipes or connections to a heat exchanger, a chiller, or other device for cooling the fluid before returning the fluid to the fluid inlet (not shown). The fluid may be any suitable liquid or gas, such as a coolant, for example, water, fluorochemical liquids, silicone oil, ethylene glycol water, poly-alpha-olefin, or silicate ester, or helium, argon, or nitrogen, that may be circulated, usually by a pump or a fan (not shown), to dissipate heat more efficiently from the second surface of the die 114. The fluid may also include additives to prevent corrosion of the different components or to allow operation at higher/lower temperatures (e.g. additives to water to decrease its freezing point or increase its boiling point). The coolant used may depend on the coolant's properties, including viscosity and heat capacity, circulation flow rate, and the temperature rise during device operation. The cooling apparatus 140 may have any suitable dimensions and any suitable shape. The cooling apparatus may be made from any suitable conductive material, such as a metal. In some embodiments, the cooling apparatus 140 may include Cu, Ag, Ni, Au, Al, or other metals or metal alloys, for example.

The package substrate 102 may include an insulating material and one or more conductive pathways through the insulating material, in accordance with various embodiments. In some embodiments, the insulating material may be provided by a single material, while in other embodiments, the insulating material may include different layers formed of different materials. For example, a "base" layer of insulating material may be provided by a glass fiber reinforced core, a rigid carrier, or a peelable core panel, for example, while additional layers of insulating material may be provided by an epoxy-based laminate. In some embodiments, the package substrate 102 may be an organic substrate. The conductive pathways (not shown) in the package substrate 102 may couple any of the die 114 to the circuit board 133 (e.g., via the first level interconnects 120 and the second-level interconnects 130).

The microelectronic assembly of FIG. 1 also may include a circuit board 133 having conductive contacts 132 on a surface. The first conductive contacts 134 on the first surface of the package substrate 102 may be coupled to the conductive contacts 132 on the circuit board 133 by second-level interconnects 130. The second-level interconnects 130 illustrated in FIG. 1 are solder balls (e.g., for a BGA arrangement), but any suitable second-level interconnects 130 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second-level interconnects 130 may not couple the package substrate 102 to a circuit board 133, but may instead couple the package substrate 102 to another IC package, an interposer, or any other suitable component.

A number of elements are not illustrated in FIG. 1, but may be present in microelectronic assembly 100, for example, additional active components, such as dies, or additional passive components, such as surface-mount resistors, capacitors, and/or inductors, may be disposed on the top surface or the bottom surface of the package substrate 102, and may be thermally connected to the cooling apparatus 140 via a TIM 180. Although FIG. 1 depicts a single, surface mounted die 114, the microelectronic assemblies 100 disclosed herein may have any suitable number of dies 114, for example, additional surface mounted dies in thermal contact with the cooling apparatus 140 via a TIM 180. More generally, the microelectronic assemblies 100 disclosed herein may have any suitable arrangement of the dies 114, and any number of the dies 114. The die 114 may include any suitable circuitry. For example, in some embodiments, the die 114 may be an active or passive die, and the die 114 may include input/output circuitry, a processor, high bandwidth memory, or enhanced dynamic random access memory (EDRAM).

Figure 2:
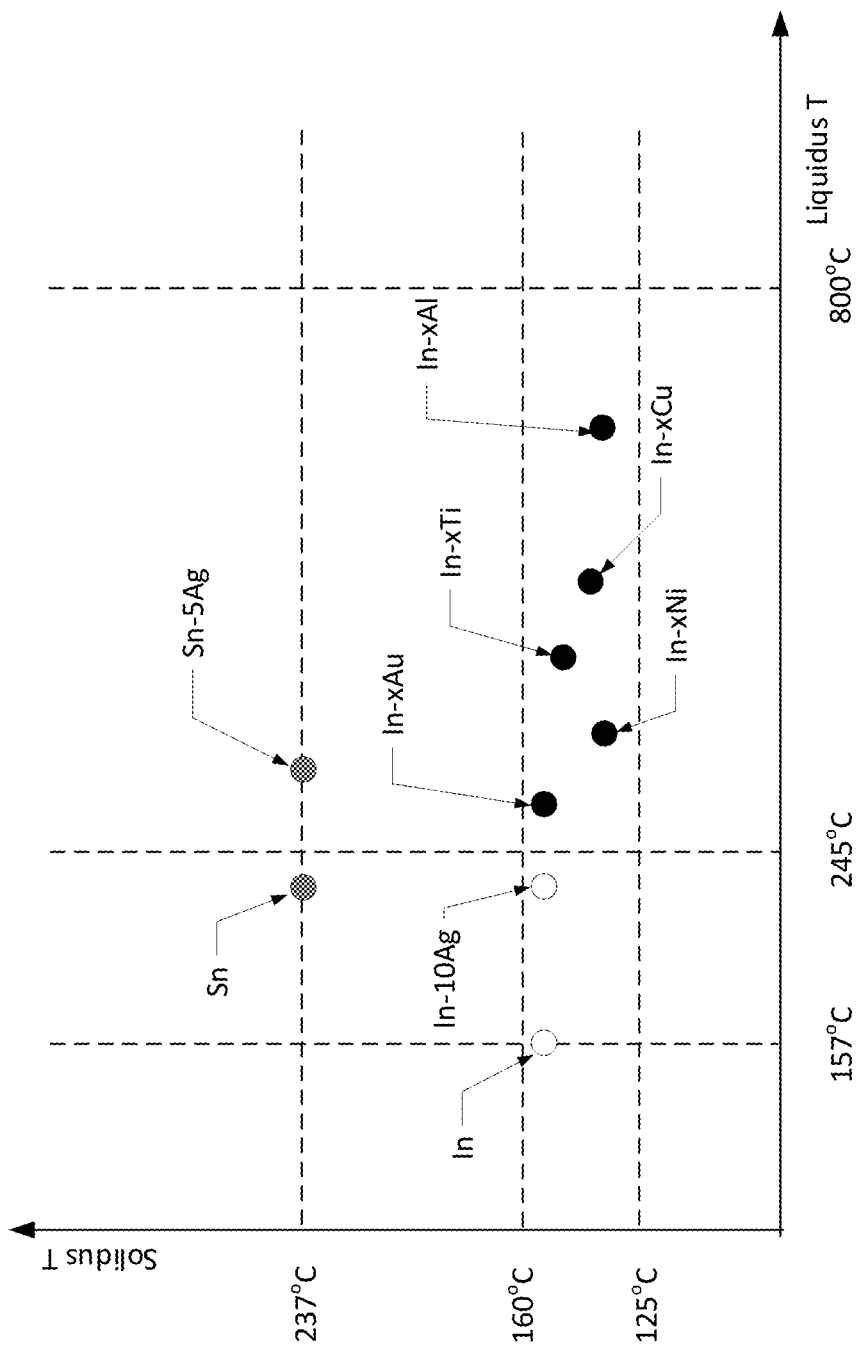
FIG. 2 is a graph showing a solidus temperature versus a liquidus temperature of various elements and alloys, in accordance with various embodiments.

FIG. 2 is a graph showing a solidus temperature versus a liquidus temperature of various elements and alloys, in accordance with various embodiments. As shown in FIG. 2, the gray dots (i.e., Sn and Sn—Ag) indicate materials having a solidus temperature that is likely higher than desirable, the white dots (i.e., In and In-10Ag) indicate materials having a liquidus temperature that is likely lower than desirable, and the black dots indicate In alloys having a desired range of solidus temperature and liquidus temperature for bonding and resistance to reflow. For example, as shown in FIG. 2, pure Sn has a melting temperature of approximately 237° C. and pure In has a melting point of approximately 158° C., both of which are lower than the BGA reflow temperature of between about 245° C. and 260° C.

Conventional TIMs that include a solder material typically employ a pure Sn or a Sn alloy. Pure Sn has a thermal conductivity of approximately 73 watts per meter per Kelvin (W/m-K) whereas pure In has a thermal conductivity of 86 W/m-K, such that Sn has a lower thermal conductivity than In and may have decreased thermal conduction performance as compared to In.

As shown in FIG. 2, a TIM of pure Sn or Sn-5Ag alloy (e.g., a Sn—Ag alloy having 5 weight percent of Ag) may have a solidus temperature of approximately 237° C. Further, as shown in FIG. 2, a TIM of pure In and an In-10Ag alloy (e.g., an In alloy having 10 weight percent Ag) may have a liquidus temperature of less than 245° C., which may increase the likelihood of seepage and/or bleeding out of the TIM. As shown in FIG. 2, in some embodiments, an In alloy TIM may have a liquidus temperature between about 245° C. and 600° C. In some embodiments, an In alloy TIM may have a liquidus temperature between about 245° C. and 800° C. As shown in FIG. 2, in some embodiments, an In alloy TIM has a solidus temperature between about 125° C. and 160° C. In some embodiments, a TIM may include an In—Au alloy having between about 0.5 weight percent and 45 weight percent of Au. In some embodiments, a TIM may include an In—Ni alloy having between about 0.5 weight percent and 18 weight percent of Ni. In some embodiments, a TIM may include an In—Ti alloy having between about 0.5 weight percent and 24 weight percent of Ti. In some embodiments, a TIM may include an In—Cu alloy having between about 3 weight percent and 30 weight percent of Cu. In some embodiments, a TIM may include an In—Al alloy having between about 0.5 weight percent and 30 weight percent of Al. In some embodiments, the TIM binary In alloys may include a third and/or fourth element to form a ternary In alloy and/or a quaternary In alloy. The ternary In alloy and quaternary In alloy may include the binary elements having the same weight percent ranges as identified for a binary In alloy, and the third and fourth elements may be included having a weight percent of up to 3. For example, a TIM may include an In—Ni—Au alloy having up to 18 weight percent of Ni and up to 3 weight percent of Au. In some embodiments, a TIM may include an In—Au—Ti alloy having up to 45 weight percent of Au and up to 3 weight percent of Ti. In some embodiments, a TIM may include an In—Cu—Ni alloy having up to 30 weight percent of Cu and up to 3 weight percent of Ni. In some embodiments, a TIM may include an In—Al—Ag—Ni alloy having up to 30 weight percent of Al, up to 3 weight percent of Ag, and up to 3 weight percent of Ni.

The microelectronic assemblies disclosed herein may be used for any suitable application. For example, in some embodiments, a microelectronic assembly 100 may be used to provide an ultra-high density and high bandwidth interconnect for field programmable gate array (FPGA) transceivers and III-V amplifiers. For example, the die 114 may include FPGA transceiver circuitry or III-V amplifiers, and/or FPGA logic.

In an example, the die 114 in a microelectronic assembly 100 may be a processing device (e.g., a central processing unit, a radio frequency chip, a power converter, a network processor, a graphics processing unit, a FPGA, a modem, an applications processor, etc.). In another example, the die 114 may include high bandwidth memory, transceiver circuitry, and/or input/output circuitry (e.g., Double Data Rate transfer circuitry, Peripheral Component Interconnect Express circuitry, etc.).

In another example, the die 114 in a microelectronic assembly 100 may be a cache memory (e.g., a third level cache memory), or a processing device (e.g., a central processing unit, a radio frequency chip, a power converter, a network processor, a graphics processing unit, a FPGA, a modem, an applications processor, etc.).

The microelectronic assemblies disclosed herein may be included in any suitable electronic component. FIGS. 3-6 illustrate various examples of apparatuses that may include, or be included in, any of the microelectronic assemblies disclosed herein.

Figure 3:
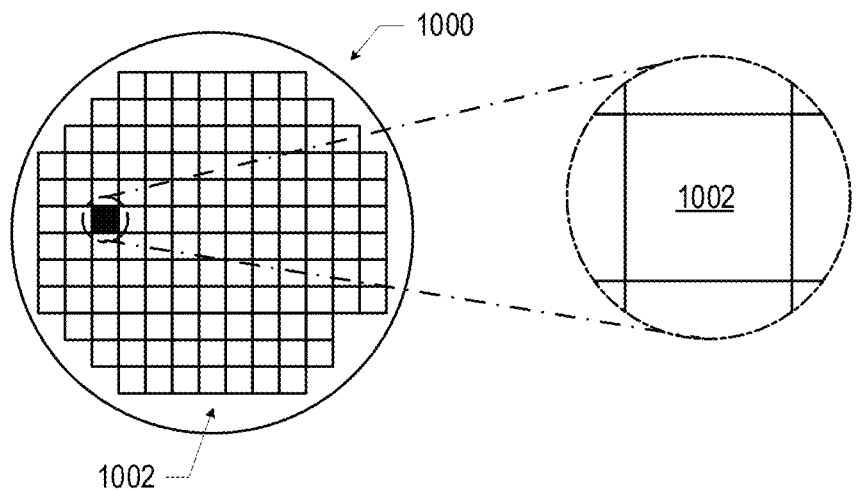
FIG. 3 is a top view of a wafer and dies that may be included in a microelectronic assembly, in accordance with any of the embodiments disclosed herein.

FIG. 3 is a top view of a wafer 1000 and dies 1002 that may be included in any of the microelectronic assemblies disclosed herein (e.g., the die 114 disclosed herein). The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may be any of the dies 102/130 disclosed herein. The die 1002 may include one or more transistors (e.g., some of the transistors 1140 of FIG. 4, discussed below), supporting circuitry to route electrical signals to the transistors, passive components (e.g., signal traces, resistors, capacitors, or inductors), and/or any other IC components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1402 of FIG. 6) or other logic that is configured to store information in the memory devices or execute instructions stored in the memory array. Various ones of the microelectronic assemblies disclosed herein may be manufactured using a die-to-wafer assembly technique in which some dies are attached to a wafer 1000 that include others of the dies, and the wafer 1000 is subsequently singulated.

Figure 4:
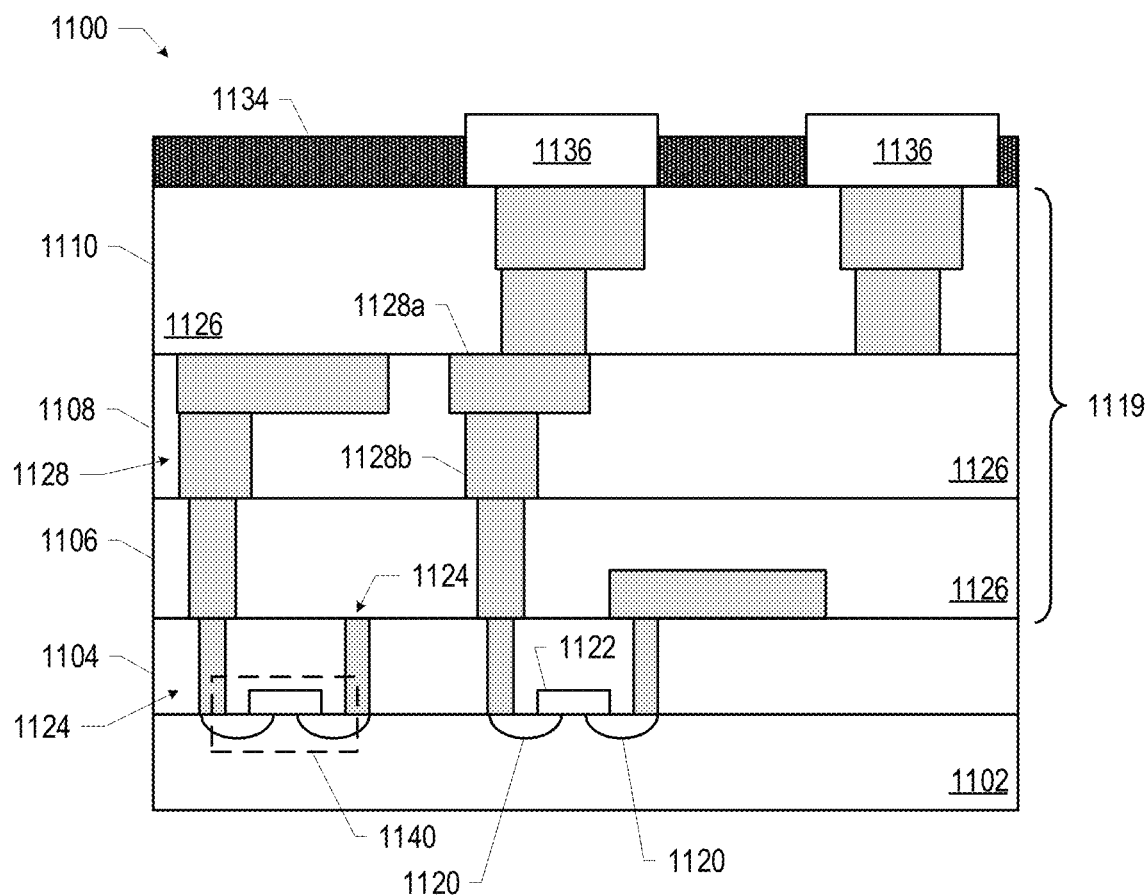
FIG. 4 is a cross-sectional side view of an integrated circuit device that may be included in a microelectronic assembly, in accordance with any of the embodiments disclosed herein.

FIG. 4 is a cross-sectional side view of an example IC device 1100 that may be included in any of the microelectronic assemblies disclosed herein (e.g., in any of the dies 114). One or more of the IC devices 1100 may be included in one or more dies 1002 (FIG. 3). The IC device 1100 may be formed on a substrate 1102 (e.g., the wafer 1000 of FIG. 3) and may be included in a die (e.g., the die 1002 of FIG. 3). The substrate 1102 may be a semiconductor substrate composed of semiconductor material systems including, for example, n-type or p-type materials systems (or a combination of both). The substrate 1102 may include, for example, a crystalline substrate formed using a bulk silicon or a silicon-on-insulator (SOI) substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1002 of FIG. 3) or a wafer (e.g., the wafer 1000 of FIG. 3).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102 and/or any other active and/or passive circuitry as may be desired by a device manufacturer. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 4 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 4 as interconnect layers 1106, 1108, and 1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the IC device 1100.

The interconnect structures 1128 may be arranged within the interconnect layers 1106-1110 to route electrical signals according to a wide variety of designs. In particular, the arrangement is not limited to the particular configuration of interconnect structures 1128 depicted in FIG. 4. For example, the interconnect structures may be arranged as multidirectional interconnect structures. Although a particular number of interconnect layers 1106-1110 is depicted in FIG. 4, embodiments of the present disclosure include IC devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the substrate 1102 upon which the device layer 1104 is formed. For example, the lines 1128a may route electrical signals in a direction in and out of the page from the perspective of FIG. 4. The vias 1128b may be arranged to route electrical signals in a direction of a plane that is substantially perpendicular to the surface of the substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 4. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include lines 1128a and/or vias 1128b, as shown. The lines 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include vias 1128b to couple the lines 1128a of the second interconnect layer 1108 with the lines 1128a of the first interconnect layer 1106. Although the lines 1128a and the vias 1128b are structurally delineated with a line within each interconnect layer (e.g., within the second interconnect layer 1108) for the sake of clarity, the lines 1128a and the vias 1128b may be structurally and/or materially contiguous (e.g., simultaneously filled during a dual-damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the IC device 1100 (i.e., farther away from the device layer 1104) may be thicker.

The IC device 1100 may include a solder resist material 1134 (e.g., polyimide or similar material) and one or more conductive contacts 1136 formed on the interconnect layers 1106-1110. In FIG. 4, the conductive contacts 1136 are illustrated as taking the form of bond pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-1110; for example, the conductive contacts 1136 may include other analogous features (e.g., posts) that route the electrical signals to external components. The conductive contacts 1136 may serve as the conductive contacts 122 or 124, as appropriate.

Figure 5:
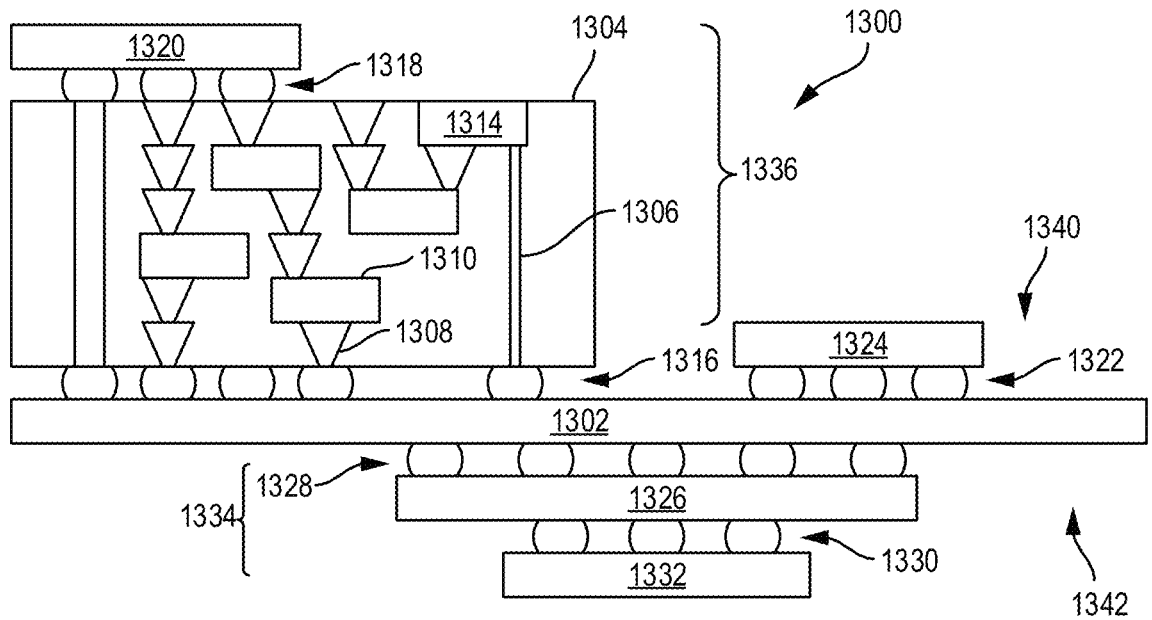
FIG. 5 is a cross-sectional side view of an integrated circuit device assembly that may include a microelectronic assembly, in accordance with any of the embodiments disclosed herein.

In embodiments in which the IC device 1100 is a double-sided die, the IC device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the IC device 1100 from the conductive contacts 1136. FIG. 5 is a cross-sectional side view of an IC device assembly 1300 that may include any of the microelectronic assemblies disclosed herein. In some embodiments, the IC device assembly 1300 may be a microelectronic assembly 100. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. Any of the IC packages discussed below with reference to the IC device assembly 1300 may take the form of any suitable ones of the embodiments of the microelectronic assemblies disclosed herein.

In some embodiments, the circuit board 1302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 5 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 5), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 5, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1002 of FIG. 3), or any other suitable component. Generally, the interposer 1304 may spread a connection to a wider pitch or reroute a connection to a different connection. For example, the interposer 1304 may couple the IC package 1320 (e.g., a die) to a set of BGA conductive contacts of the coupling components 1316 for coupling to the circuit board 1302. In the embodiment illustrated in FIG. 5, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 5 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 6:
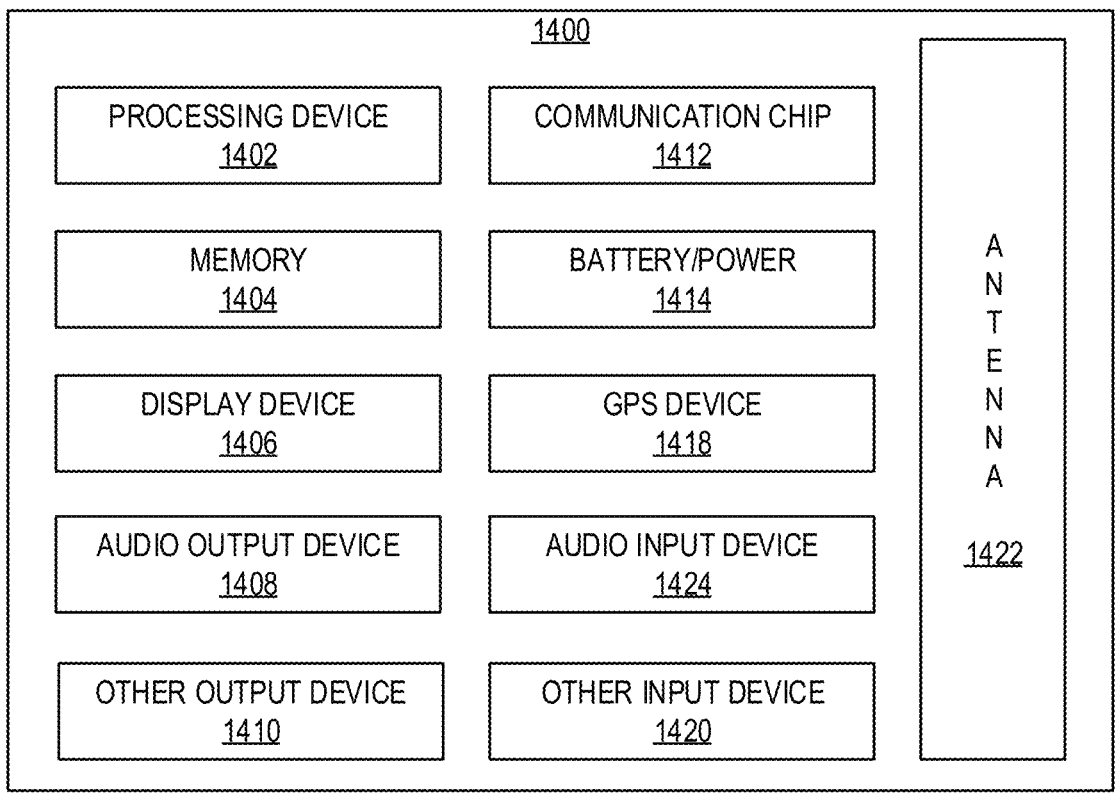
FIG. 6 is a block diagram of an example electrical device that may include a microelectronic, in accordance with any of the embodiments disclosed herein.

FIG. 6 is a block diagram of an example electrical device 1400 that may include one or more of the microelectronic assemblies disclosed herein. For example, any suitable ones of the components of the electrical device 1400 may include one or more of the IC device assemblies 1300, IC devices 1100, or dies 1002 disclosed herein, and may be arranged in any of the microelectronic assemblies disclosed herein. A number of components are illustrated in FIG. 6 as included in the electrical device 1400, but any one or more of these components may be omitted or duplicated, as suitable for the application. In some embodiments, some or all of the components included in the electrical device 1400 may be attached to one or more motherboards. In some embodiments, some or all of these components are fabricated onto a single system-on-a-chip (SoC) die.

Additionally, in various embodiments, the electrical device 1400 may not include one or more of the components illustrated in FIG. 6, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-M RAM).

In some embodiments, the electrical device 1400 may include a communication chip 1412 (e.g., one or more communication chips). For example, the communication chip 1412 may be configured for managing wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as global positioning system (GPS), EDGE, GPRS, CDMA, WiMAX, LTE, EV-DO, or others. In some embodiments, a first communication chip 1412 may be dedicated to wireless communications, and a second communication chip 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any device that generates an audible indicator, such as speakers, headsets, or earbuds.

The electrical device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The electrical device 1400 may include a GPS device 1418 (or corresponding interface circuitry, as discussed above). The GPS device 1418 may be in communication with a satellite-based system and may receive a location of the electrical device 1400, as known in the art.

The electrical device 1400 may include another output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include another input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1400 may be any other electronic device that processes data.

The following paragraphs provide various examples of the embodiments disclosed herein.

Example 1 is a microelectronic assembly, including: a package substrate having a first surface and an opposing second surface; a die having a first surface and an opposing second surface, wherein the first surface of the die is coupled to the second surface of the package substrate; a cooling apparatus thermally coupled to the second surface of the die; and a thermal interface material (TIM) between the second surface of the die and the cooling apparatus, wherein the TIM includes indium, and one or more of: nickel, gold, titanium, copper, and aluminum.

Example 2 may include the subject matter of Example 1, and may further specify that the TIM includes nickel having a weight percent between 0.5 and 18.

Example 3 may include the subject matter of Example 1, and may further specify that the TIM includes gold having a weight percent between 0.5 and 45.

Example 4 may include the subject matter of Example 1, and may further specify that the TIM includes titanium having a weight percent between 0.5 and 24.

Example 5 may include the subject matter of Example 1, and may further specify that the TIM includes copper having a weight percent between 3 and 30.

Example 6 may include the subject matter of Example 1, and may further specify that the TIM includes aluminum having a weight percent between 0.5 and 30.

Example 7 may include the subject matter of Example 1, and may further specify that the TIM includes indium, nickel, and gold.

Example 8 may include the subject matter of Example 7, and may further specify that nickel has a weight percent of up to 18, and gold has a weight percent of up to 3.

Example 9 may include the subject matter of Example 1, and may further specify that the TIM includes indium, gold, and titanium.

Example 10 may include the subject matter of Example 9, and may further specify that gold has a weight percent of up to 45, and titanium has a weight percent of up to 3.

Example 11 may include the subject matter of Example 1, and may further specify that the TIM includes indium, gold, and silver.

Example 12 may include the subject matter of Example 11, and may further specify that gold has a weight percent of up to 45, and silver has a weight percent of up to 3.

Example 13 may include the subject matter of Example 1, and may further include: a circuit board, wherein a surface of the circuit board is coupled to the first surface of the package substrate.

Example 14 may include the subject matter of Example 13, and may further specify that the circuit board is coupled to the package substrate by first level interconnects, and the first level interconnects may include ball grid array interconnects.

Example 15 may include the subject matter of Example 1, and may further specify that the cooling apparatus includes a heat sink, a heat spreader, an integrated heat spreader, or a cooling plate.

Example 16 is a microelectronic assembly, including: a package substrate having a first surface and an opposing second surface; a die having a first surface and an opposing second surface, wherein the first surface of the die is coupled to the second surface of the package substrate; a cooling apparatus thermally coupled to the second surface of the die; and a thermal interface material (TIM) between the second surface of the die and the cooling apparatus, wherein the TIM includes an indium alloy having a liquidus temperature equal to or greater than 245 degrees Celsius.

Example 17 may include the subject matter of Example 16, and may further specify that the indium alloy includes one or more of: nickel, gold, titanium, copper, and aluminum.

Example 18 may include the subject matter of Example 17, and may further specify that the indium alloy includes nickel having a weight percent between 0.5 and 18.

Example 19 may include the subject matter of Example 17, and may further specify that the indium alloy includes gold having a weight percent between 0.5 and 45.

Example 20 may include the subject matter of Example 17, and may further specify that the indium alloy includes titanium having a weight percent between 0.5 and 24.

Example 21 may include the subject matter of Example 17, and may further specify that the indium alloy includes copper having a weight percent between 3 and 30.

Example 22 may include the subject matter of Example 17, and may further specify that the indium alloy includes aluminum having a weight percent between 0.5 and 30.

Example 23 may include the subject matter of Example 17, and may further specify that the indium alloy includes indium, gold, and copper.

Example 24 may include the subject matter of Example 23, and may further specify that gold has a weight percent between 0.5 and 45, and copper has a weight percent of up to 3.

Example 25 may include the subject matter of Example 17, and may further specify that the indium alloy includes indium, copper, and nickel.

Example 26 may include the subject matter of Example 25, and may further specify that copper has a weight percent between 3 and 30, and nickel has a weight percent of up to 3.

Example 27 may include the subject matter of Example 17, and may further specify that the indium alloy includes indium, aluminum, silver, and nickel.

Example 28 may include the subject matter of Example 27, and may further specify that aluminum has a weight percent between 0.5 and 30, silver has a weight percent of up to 3, and nickel has a weight percent of up to 3.

Example 29 may include the subject matter of Example 16, and may further include: a circuit board, wherein a surface of the circuit board is coupled to the first surface of the package substrate.

Example 30 may include the subject matter of Example 29, and may further specify that the circuit board is coupled to the package substrate by ball grid array interconnects.

Example 31 may include the subject matter of Example 16, and may further specify that the TIM has a thickness between 25 microns and 500 microns.

Example 32 is a thermal interface material for bonding components of electronic components, the thermal interface material including: an indium alloy having a liquidus temperature equal to or greater than 245 degrees Celsius, wherein the indium alloy includes one or more of: nickel, gold, titanium, copper, and aluminum.

Example 33 may include the subject matter of Example 32, and may further specify that the indium alloy includes nickel having a weight percent between 0.5 and 18.

Example 34 may include the subject matter of Example 32, and may further specify that the indium alloy includes gold having a weight percent between 0.5 and 45.

Example 35 may include the subject matter of Example 32, and may further specify that the indium alloy includes titanium having a weight percent between 0.5 and 24.

Example 36 may include the subject matter of Example 32, and may further specify that the indium alloy includes copper having a weight percent between 3 and 30.

Example 37 may include the subject matter of Example 32, and may further specify that the indium alloy includes aluminum having a weight percent between 0.5 and 30.

Example 38 may include the subject matter of Example 32, and may further specify that the indium alloy includes indium, gold, and titanium.

Example 39 may include the subject matter of Example 38, and may further specify that gold has a weight percent between 0.5 and 45, and titanium has a weight percent of up to 3.

Example 40 may include the subject matter of Example 32, and may further specify that the indium alloy includes indium, copper, and nickel.

Example 41 may include the subject matter of Example 40, and may further specify that copper has a weight percent between 3 and 30, and nickel has a weight percent of up to 3.

Example 42 may include the subject matter of Example 32, and may further specify that the indium alloy includes indium, nickel, and gold.

Example 43 may include the subject matter of Example 42, and may further specify that nickel has a weight percent between 0.5 and 18, and gold has a weight percent of up to 3.

Example 44 is a computing device, including: a microelectronic assembly, including: a package substrate having a first surface and an opposing second surface; a die having a first surface and an opposing second surface, wherein the first surface of the die is coupled to the second surface of the package substrate; a cooling apparatus thermally coupled to the second surface of the die; and a thermal interface material (TIM) between the cooling apparatus and the second surface of the die, wherein the TIM includes an indium alloy having a liquidus temperature between 245 degrees Celsius and 400 degrees Celsius and a solidus temperature between 125 degrees Celsius and 160 degrees Celsius.

Example 45 may include the subject matter of Example 44, and may further specify that the indium alloy includes one or more of: nickel, gold, titanium, copper, and aluminum.

Example 46 may include the subject matter of Example 45, and may further specify that the indium alloy includes nickel having a weight percent between 0.5 and 18.

Example 47 may include the subject matter of Example 45, and may further specify that the indium alloy includes gold having a weight percent between 0.5 and 45.

Example 48 may include the subject matter of Example 45, and may further specify that the indium alloy includes titanium having a weight percent between 0.5 and 24.

Example 49 may include the subject matter of Example 45, and may further specify that the indium alloy includes copper having a weight percent between 3 and 30.

Example 50 may include the subject matter of Example 45, and may further specify that the indium alloy includes aluminum having a weight percent between 0.5 and 30.

Example 51 may include the subject matter of Example 45, and may further specify that the indium alloy includes indium, nickel, and gold.

Example 52 may include the subject matter of Example 45, and may further specify that the indium alloy includes indium, copper, and nickel.

Example 53 may include the subject matter of Example 45, and may further specify that the indium alloy includes indium, gold, and titanium.

Example 54 may include the subject matter of Example 44, and may further include: a circuit board, wherein a surface of the circuit board is coupled to the first surface of the package substrate.

Example 55 may include the subject matter of Example 54, and may further specify that the circuit board is coupled to the package substrate by ball grid array interconnects.

Example 56 may include the subject matter of Example 44, and may further include: an electronic component mounted on the first surface of the package substrate or the second surface of the package substrate by surface-mount technology.

The invention claimed is:

1. A microelectronic assembly, comprising:
a package substrate having a first surface and an opposing second surface;
a die having a first surface and an opposing second surface, wherein the first surface of the die is coupled to the second surface of the package substrate;
a cooling apparatus thermally coupled to the second surface of the die; and
a thermal interface material (TIM) between the second surface of the die and the cooling apparatus, wherein the TIM is a ternary indium alloy that includes indium, titanium, and copper or aluminum, and wherein the ternary indium alloy further includes copper or aluminum having a weight percent of 30 or less.

2. The microelectronic assembly of claim 1, wherein the ternary indium alloy includes aluminum having a weight percent of 30 or less.

3. The microelectronic assembly of claim 1, wherein the ternary indium alloy includes copper having a weight percent of 3 or less.

4. The microelectronic assembly of claim 1, wherein the ternary indium alloy includes aluminum having a weight percent of 3 or less.

5. The microelectronic assembly of claim 1, further comprising:
a circuit board, wherein a surface of the circuit board is coupled to the first surface of the package substrate.

6. The microelectronic assembly of claim 5, wherein the circuit board is coupled to the package substrate by ball grid array interconnects.

7. The microelectronic assembly of claim 1, wherein the cooling apparatus includes a heat sink, a heat spreader, an integrated heat spreader, or a cooling plate.

8. A microelectronic assembly, comprising:
a package substrate having a first surface and an opposing second surface;
a die having a first surface and an opposing second surface, wherein the first surface of the die is coupled to the second surface of the package substrate;
a cooling apparatus thermally coupled to the second surface of the die; and
a thermal interface material (TIM) between the second surface of the die and the cooling apparatus, the TIM having a liquidus temperature between 245 degrees Celsius and 800 degrees Celsius, and wherein the TIM is a ternary indium alloy that includes indium, titanium, and copper or aluminum, and wherein the ternary indium alloy includes copper or aluminum having a weight percent of 30 or less.

9. The microelectronic assembly of claim 8, wherein the ternary indium alloy includes copper having a weight percent of 30 or less.

10. The microelectronic assembly of claim 8, wherein the ternary indium alloy includes copper having a weight percent of 3 or less.

11. The microelectronic assembly of claim 8, wherein the ternary indium alloy includes aluminum having a weight percent of 3 or less.

12. The microelectronic assembly of claim 8, wherein the TIM has a thickness between 25 microns and 500 microns.

13. A thermal interface material for bonding components of electronic components, the thermal interface material comprising:
a ternary indium alloy having a liquidus temperature between 245 degrees Celsius and 800 degrees Celsius, wherein the ternary indium alloy includes indium, titanium, and copper or aluminum, and wherein the ternary indium alloy includes copper or aluminum having a weight percent of 30 or less.

* * * * *